(12) United States Patent
Gruening et al.

(10) Patent No.: US 6,204,140 B1
(45) Date of Patent: Mar. 20, 2001

(54) DYNAMIC RANDOM ACCESS MEMORY

(75) Inventors: Ulrike Gruening; Jochen Beintner, both of Wappingers Falls; Scott Halle, Hopewell Junction; Jack A. Mandelman, Stormville; Carl J. Radens, LaGrangeville; Juergen Wittmann, Fishkill, all of NY (US); Jeffrey J. Welser, Stamford, CT (US)

(73) Assignees: Infineon Technologies North America Corp., San Jose, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/275,337

(22) Filed: Mar. 24, 1999

(51) Int. Cl.[7] .................................................. H01L 21/8242
(52) U.S. Cl. ......................... 438/386; 438/391; 438/239; 438/243; 438/248
(58) Field of Search ..................................... 438/386, 391, 438/239, 243, 248

(56) References Cited

U.S. PATENT DOCUMENTS

| | | | |
|---|---|---|---|
| 5,360,758 | * | 11/1994 | Bronner et al. . |
| 5,661,320 | * | 8/1997 | Moriya . |
| 5,717,628 | * | 2/1998 | Hammerl et al. . |
| 5,844,266 | * | 12/1998 | Stengl et al. . |
| 6,037,210 | * | 3/2000 | Leas . |
| 6,066,526 | * | 5/2000 | Hakey et al. . |
| 6,074,909 | * | 6/2000 | Gruening . |

* cited by examiner

Primary Examiner—Stephen D. Meier
(74) Attorney, Agent, or Firm—Stanton C. Braden

(57) ABSTRACT

A method includes forming a trench capacitor in a semiconductor body. A recess is formed in the upper portion of the capacitor with such recess having sidewalls in the semiconductor body. A first material is deposited over the sidewalls and over a bottom of the recess. A second material is deposited over the first material. A mask is provided over the second material. The mask has: a masking region to cover one portion of said recess bottom; and a window over a portion of said recess sidewall and another portion of said recess bottom to expose underlying portions of the second material. Portions of the exposed underlying portions of the second material are selectively removing while leaving substantially un-etched exposed underlying portions of the first material. The exposed portions of the first material and underlying portions of the semiconductor body are selectively removed. An isolation region is formed in the removed portions of the semiconductor body. The mask is provided over the second material with a masking region covering one portion of said recess sidewall and one portion of said recess bottom and with a window disposed over an opposite portion of said recess sidewall and an opposite portion of said recess bottom to expose underlying portions of the second material. Etching is provided into the exposed underlying portions of the semiconductor body to form a shallow trench in the semiconductor body. An insulating material is formed in the shallow trench to form a shallow trench isolation region. With such method, greater mask misalignment tolerances are permissible.

7 Claims, 12 Drawing Sheets

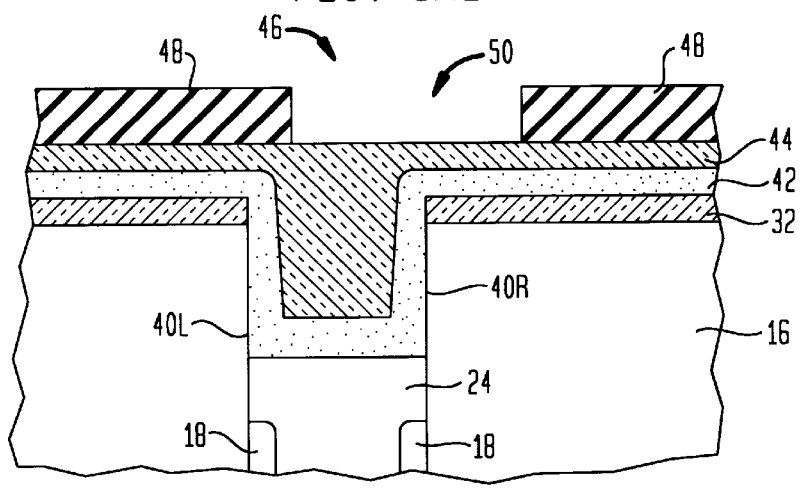
FIG. 5A1
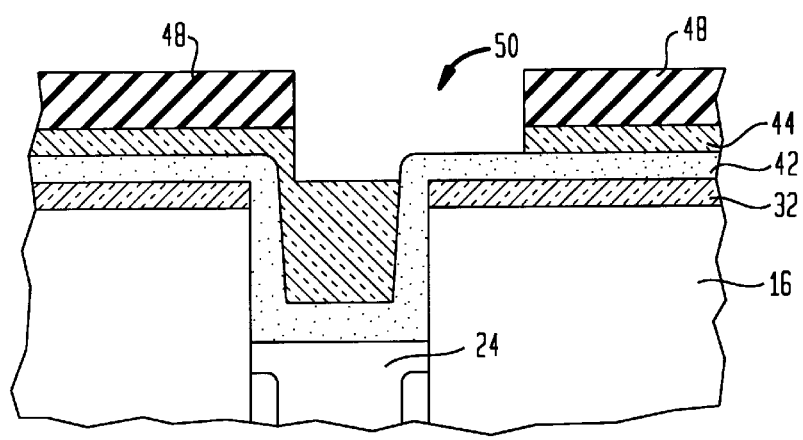
FIG. 6A1
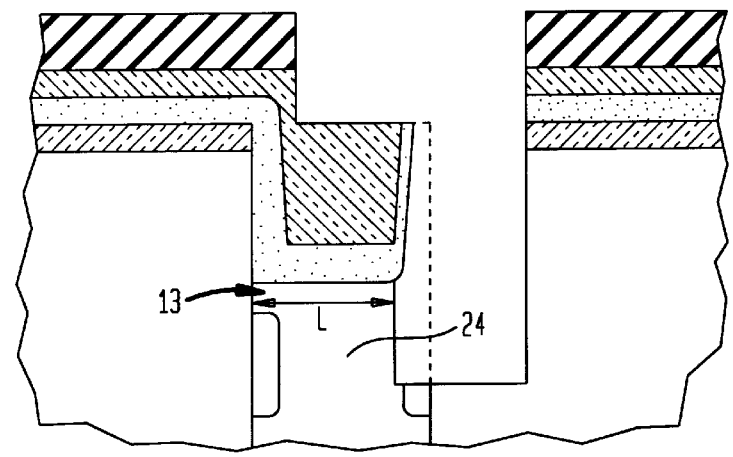
FIG. 7A1

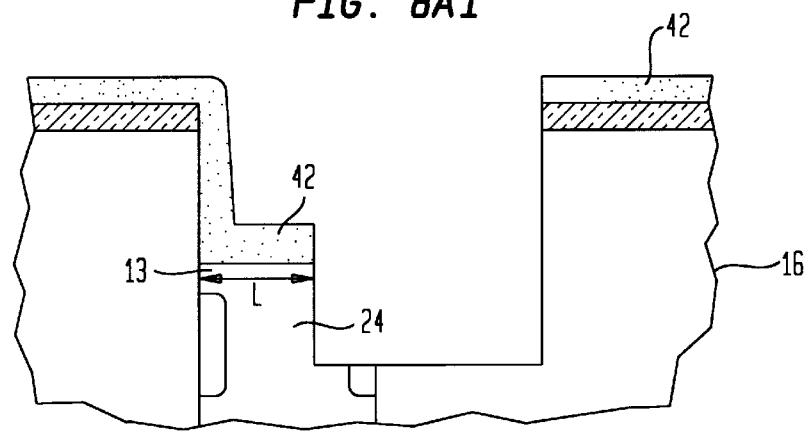
FIG. 8A1
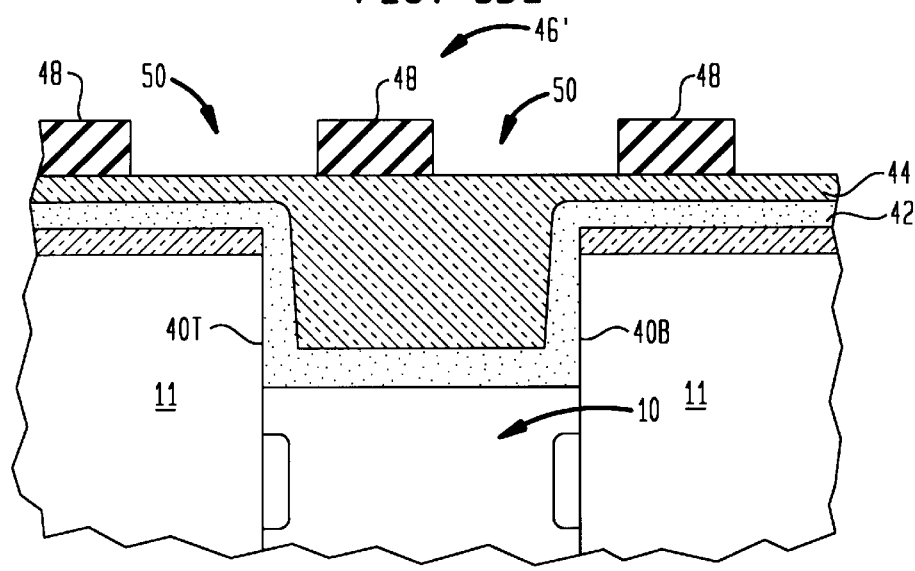
FIG. 5B1
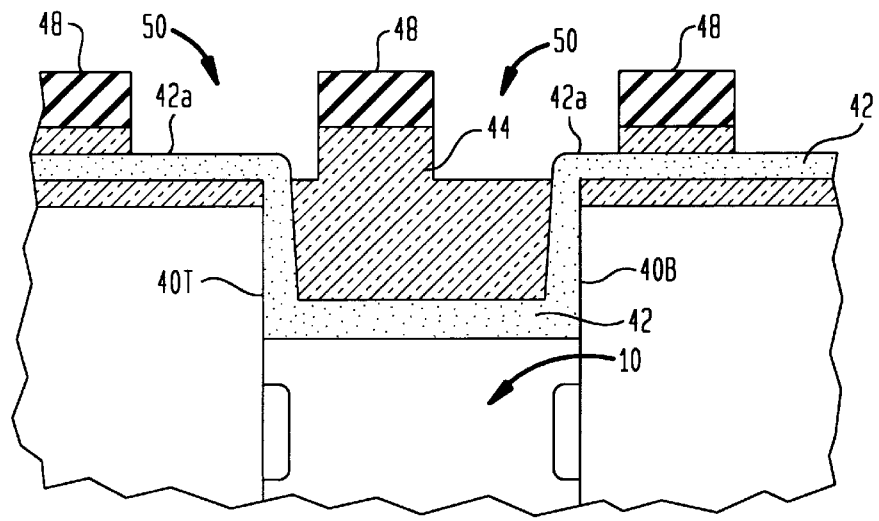
FIG. 6B1

FIG. 7B1
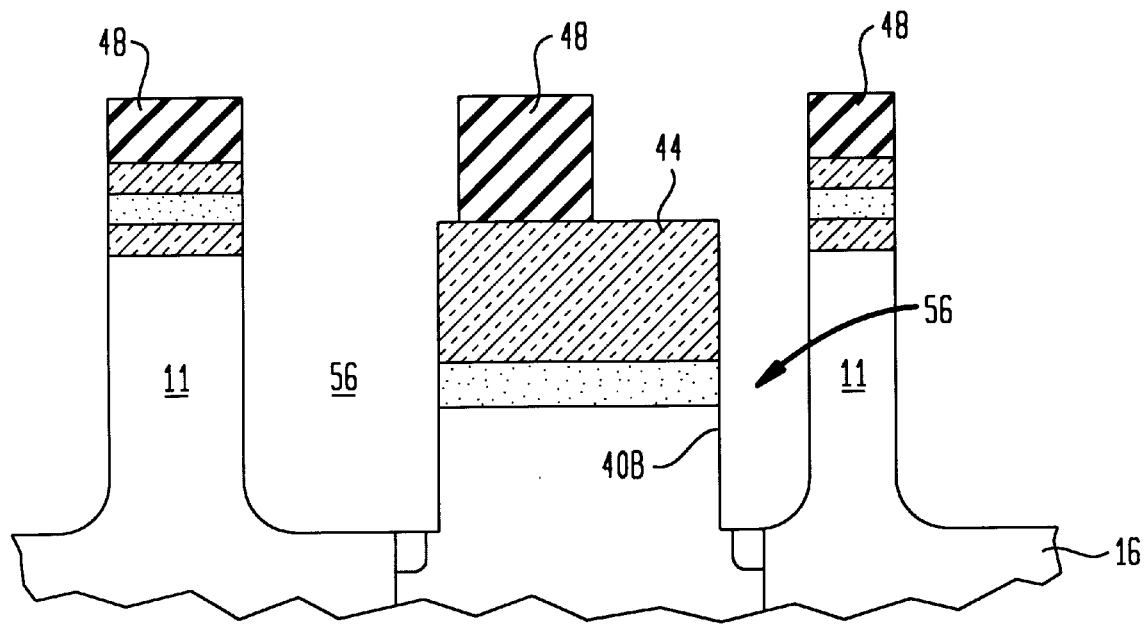
FIG. 8B1
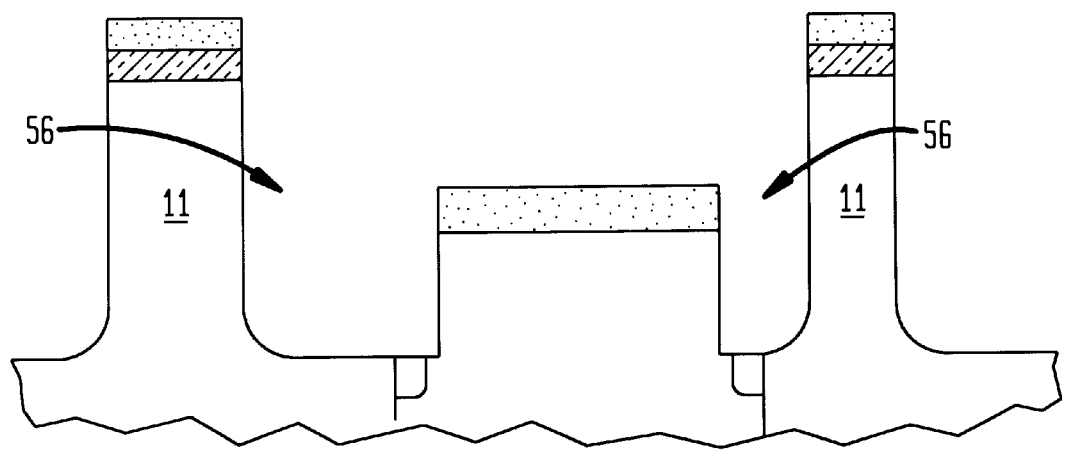

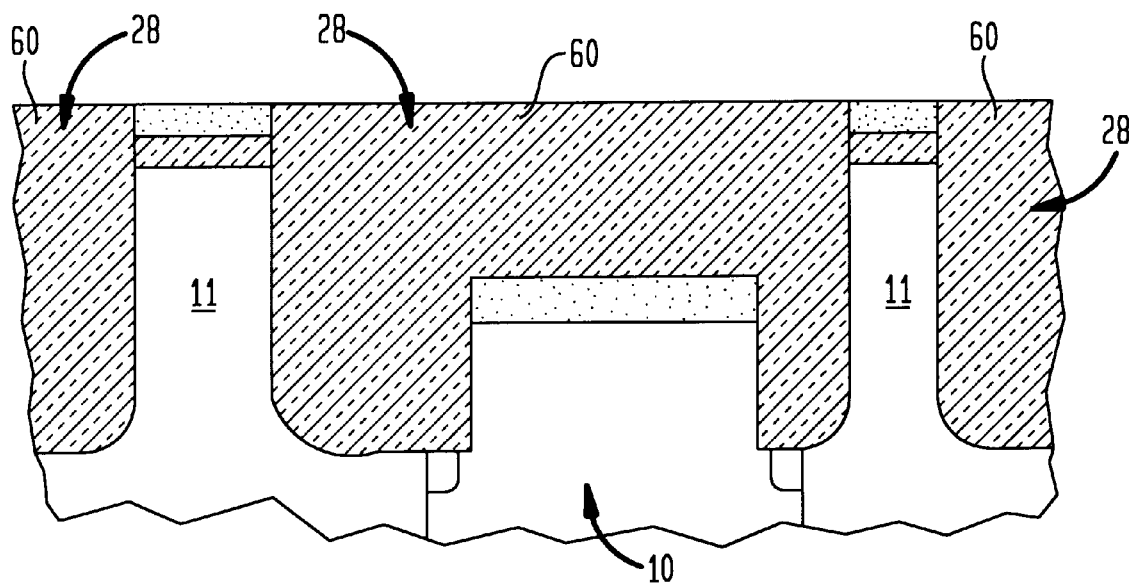
FIG. 9B1

DYNAMIC RANDOM ACCESS MEMORY

BACKGROUND OF THE INVENTION

This invention relates generally to semiconductors and more particularly to dynamic random access memories (DRAMs).

As is known in the art, DRAMs are made of storage cells having two main components: a storage capacitor; and, a transistor for enabling the transfer of charge to and from the capacitor. In trench type DRAMs, the capacitor is located in a deep trench which is etched into a semiconductor substrate. More particularly, the trench has a conductive material which provides a first electrode (i.e., sometimes referred to a the storage node) for the capacitor. The trench has a dielectric on its walls which provides the dielectric for the capacitor. A doped region in the substrate provides the second electrode for the capacitor. The first electrode is coupled to one of the source/drain regions of the cell's transistor through a coupling region formed in the semiconductor between an upper portion of the conductive region and a buried strap formed in the substrate.

Conventional DRAM arrays are organized so that multiple storage cells are positioned as close as possible to one another. In order to operate properly, it is essential that the transistor of one cell be electrically isolated from the transistor of an adjacent cell. These transistors are formed in active areas of the semiconductor substrate. These active areas are defined by a masking and etching process. One such process is sometimes referred to as shallow trench isolation (STI). More particularly, as described in U.S. Pat. No. 5,717,628 entitled Nitride Cap Formation in DRAM Capacitors, issued Feb. 10, 1998, after forming the trench capacitor, a vertical area is etched into the electrically active silicon substrate and filled with oxide. This etching of the vertical area is typically performed using a mask which must be properly aligned with the trench capacitor. More particularly, as the mask becomes positioned closer to the transistor region, the resistance of the coupling region increases; whereas if the mask becomes positioned further from the transistor region of the cell, the likelihood that the active areas of two adjacent cells becoming electrically connected to one capacitor increases.

SUMMARY OF THE INVENTION

In accordance with the invention, a method is provided including forming a trench capacitor in a semiconductor body. A recess is formed in the upper portion of the capacitor with such recess having sidewalls in the semiconductor body. A first material is deposited over the sidewalls and over a bottom of the recess. A second material is deposited over the first material. A mask is provided over the second material, such mask having: a masking region to cover one portion of said recess bottom; and a window over another portion of said recess bottom and over a portion of said recess sidewall, to expose underlying portions of the second material. Portions of the exposed underlying portions of the second material are removed while leaving substantially un-etched exposed underlying portions of the first material. The exposed portions of the first material and underlying portions of the semiconductor body are removed. An isolation region is formed in the removed portions of the semiconductor body.

With such method, greater mask misalignment tolerances are permissible without corresponding changes in the length, and therefore the resistance, of a coupling region in the storage node of the capacitor which is electrically connected to the cell transistor through the coupling region. Further, greater mask misalignment tolerances are permissible while forming electrical isolated active areas.

In accordance with one embodiment of the invention, the mask is provided over the second material with a masking region covering one portion of said recess sidewall and one portion of said recess bottom and with a window disposed over an opposite portion of said recess sidewall and an opposite portion of said recess bottom to expose underlying portions of the second material.

In accordance with another embodiment of the invention, etching is provided into the exposed underlying portions of the semiconductor body to form a shallow trench in the semiconductor body; and, an insulating material is formed in the shallow trench to form a shallow trench isolation region.

BRIEF DESCRIPTION OF THE DRAWING

These and other features of the invention, as well as the invention itself will become more readily apparent when read together with the following detailed description taken together with the accompanying drawings, in which:

FIG. 1A is a schematic diagram of the DRAM cell of FIG.1;

FIGS. 5A–10A are cross-sectional elevation views of the portion of a semiconductor body having the trench capacitor formed therein at various stages in the fabrication of the cell of FIG. 1 after the mask of FIG. 5 is positioned as shown in FIG. 5, the cross-section of FIG. 5A being taken along line 5A—5A of FIG. 5;

FIGS. 5A'–8A' are cross-sectional elevation views of the portion of a semiconductor body having the trench capacitor formed therein at various stages in the fabrication of the cell of FIG. 1 after the mask of FIG. 5 is positioned as shown in FIG. 5, the cross-sections of FIG. 5A' corresponding to the cross-sections of FIGS. 5A–8A with the mask of FIG. 5 misaligned somewhat to the left of the position shown in FIG. 5A;

FIGS. 5B–9B are cross-sectional elevation views of the portion of a semiconductor body having the trench capacitor formed therein at various stages in the fabrication of the cell of FIG. 1 after the mask of FIG. 5 is positioned as shown in FIG. 5, the cross-section of FIG. 5A being taken along line 5B—5B of FIG. 5;

FIGS. 5B'–9B' are cross-sectional elevation views of the portion of a semiconductor body having the trench capacitor formed therein at various stages in the fabrication of the cell of FIG. 1 after the mask of FIG. 5 is positioned as shown in FIG. 5, the cross-sections of FIG. 5A' corresponding to the cross-sections of FIGS. 5A–8A with the mask of FIG. 5 misaligned somewhat to the top of the position shown in FIG. 5B.

DESCRIPTION OF THE PREFERRED EMBODIMENTS

Figure 1:
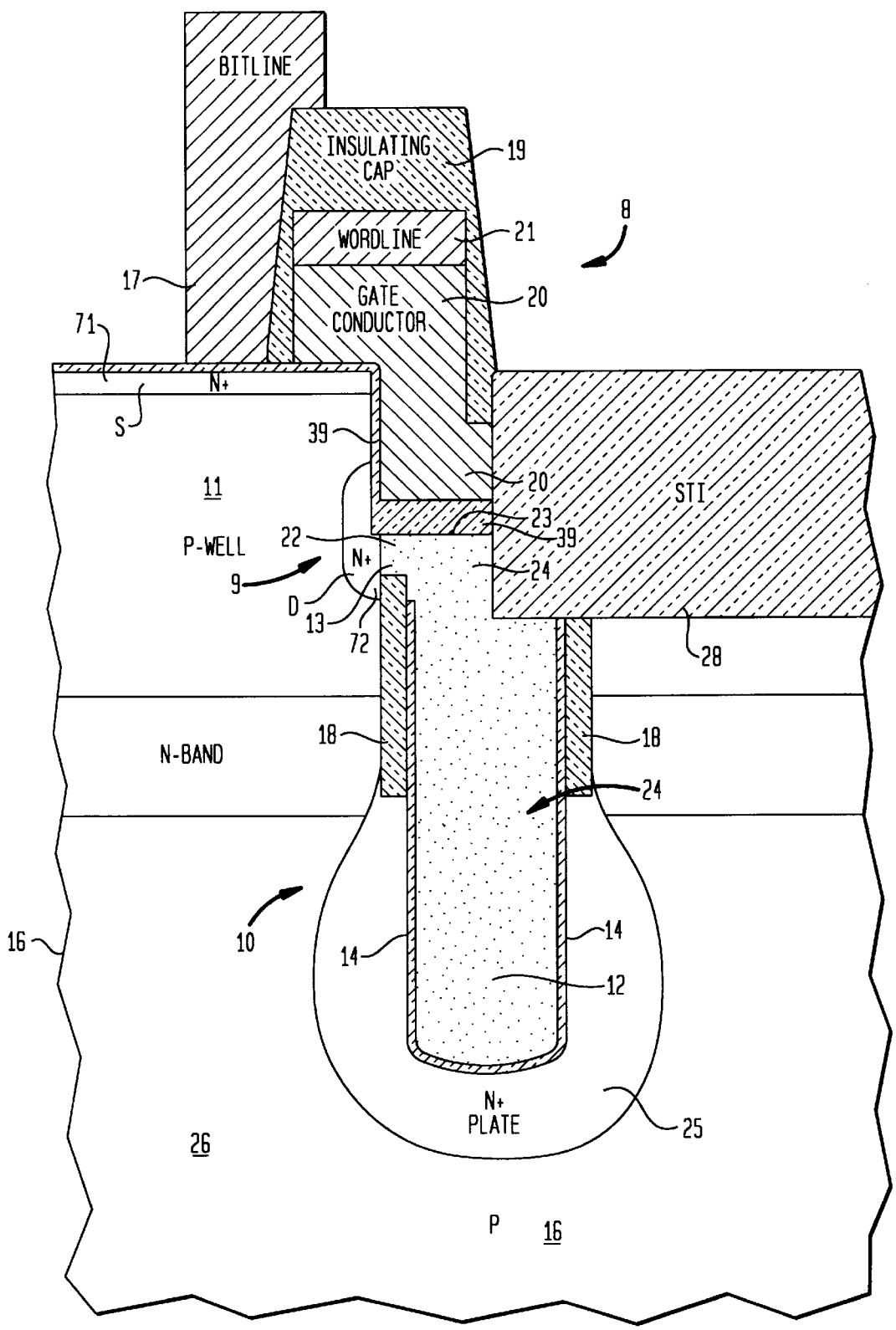
FIG. 1 is a cross-sectional sketch of a DRAM cell made in accordance with the invention.

Referring now to FIGS. 1 and 1A, an exemplary one of an array of identical DRAM cells 8 in a semiconductor, here silicon body 16 is shown. Such exemplary DRAM cell 8 (FIG. 1A) has a partially vertical MOS transistor 9 electrically connected to a trench capacitor 10, both the MOS transistor 9 and the capacitor 10 being formed in an electrically isolated active area 11 of the semiconductor body 16. The source S of the MOS transistor 9 (here an $N^+$ doped region) is electrically connected to a BITLINE 17, the drain D of the MOS transistor 9 is electrically connected to one electrode 24 of the capacitor 10 through a conductive buried strap region 22. The carrier flow between the source S and the drain D of the transistor 9 is through a gate channel G, such carrier flow being controlled by a gate electrode, here the WORDLINE, as indicated. The WORDLINE is electrically insulated from a BITLINE by insulating cap 19. It is noted that the gate electrode includes a doped polycrystalline silicon region 20 and a metal conductor 21 which provides the WORDLINE. Further, the doped polycrystalline region 20 is electrically isolated from the capacitor electrode 24 by a dielectric 23. A second electrode for the capacitor 10 is provided by $N^+$ region 25 which is insulated from electrode 24 by insulator 14.

More particularly, the first upper portion 13 of the electrode 24 of capacitor 10 (i.e., a doped coupling region 13) is electrically coupled to the $N^+$ drain region D transistor 9 through a buried, conductive strap 22 in the semiconductor body 16 and an opposite, second upper portion of such capacitor 10 is disposed contiguous to an isolation region 28 defining a portion of the active area 11 having the transistor 9 of the cell 8. The trench capacitor 10, which is etched into a single crystal P type doped silicon substrate 16, has a conventional oxide collar 18, as shown. The lower portion, or level, of the trench 12 is here filled with an $N^+$ doped polycrystalline silicon (i.e., polysilicon) material 12 to provide the first electrode 24 of capacitor 10 and which is electrically isolated from a buried $N^+$ region second electrode 25 by an insulating node dielectric barrier, i.e., insulator 14. The storage node 24 of the capacitor 10 is typically formed from highly doped $N^+$ polysilicon and is connected to the drain region D of the transistor 9 through the self-aligned buried strap 22. The shallow trench isolation (STI) region 28 which isolates this cell 8 from adjacent cells in the array.

Thus, in summary, an array of DRAM cells 8 is provided in the semiconductor body 16. Each one of such cells 8 has a transistor 9 in a corresponding electrically isolated active area 11 of the semiconductor body 16 and a capacitor 10 disposed in the trench 12 in such semiconductor body 16. A first upper portion, i.e., the coupling region 13, of the capacitor 10 (i.e., the storage node 24) is electrically coupled to one of the source S/drain D regions of the transistor 9 through the buried strap 22 in the semiconductor body 16 and an opposite, second upper portion of such capacitor 10 is disposed contiguous to the STI isolation region 28 defining a portion of the active area 11 having therein the transistor 9 of such cell 8. The second electrode of the capacitor is provided by $N^+$ electrode region 25. The WORDLINE is insulated from the drain D, the coupling region 13 and the doped polysilicon 24 by the insulator 23.

Figure 2:
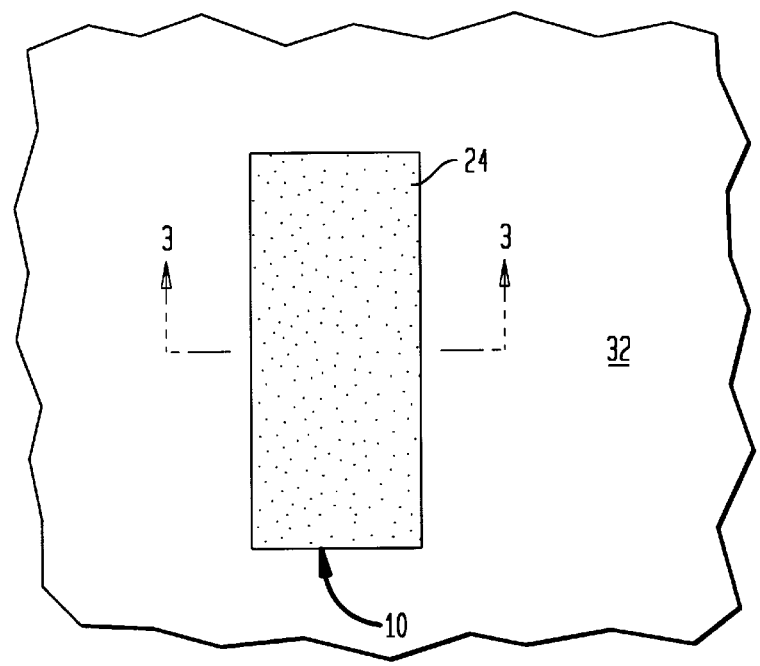
FIG. 2 is a plan view of a portion of a semiconductor body having a trench capacitor formed therein.
Figure 3:
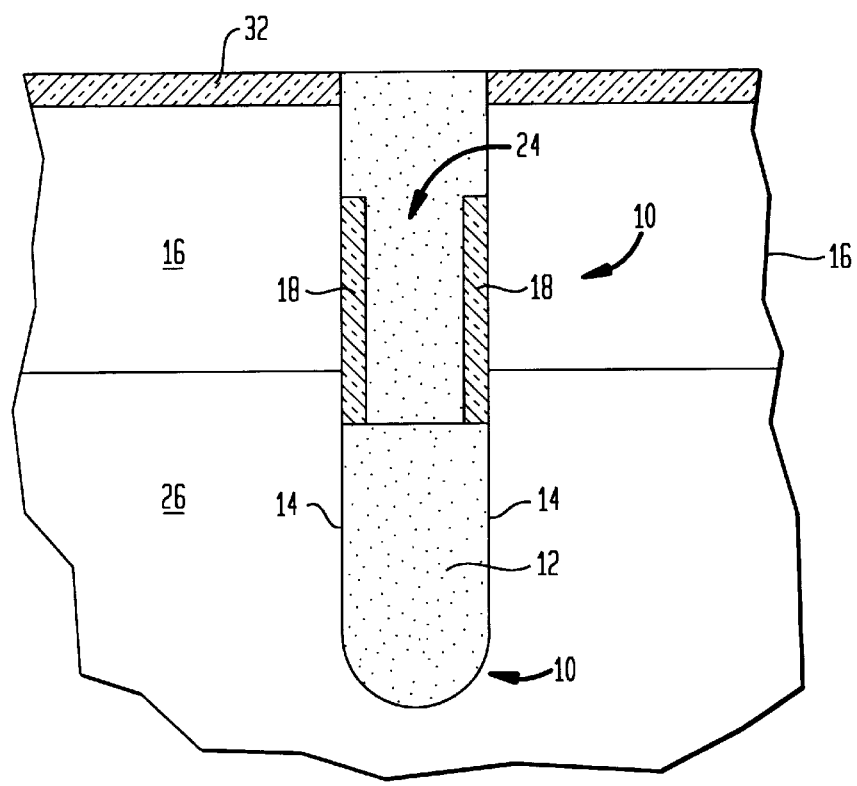
FIG. 3 is a cross-sectional elevation view of the portion of a semiconductor body having the trench capacitor formed therein, such cross-section being taken along line 3—3 in FIG. 2.

Referring now to FIGS. 2 through 5, 5A through 10A, 5A' through 8A', 5B through 9B, and 5A' through 9B', the method for forming cell 8 will be described with like elements and materials being designated with the same numerical designation as in FIG. 1. An array of trench capacitors 10, such as that described in FIG. 1, is formed in the semiconductor body 16, as shown in FIGS. 2 and 3, for an exemplary one of the capacitors 10. Each one of the capacitors 10 includes: the insulator 14 on lower sidewall portions thereof and the conductive material 24 (i.e., the storage node) disposed in the trench 12. A lower portion of the conductive material 24, here doped polysilicon, is disposed on the insulator 14 and an upper portion of the conductive material 24 is disposed on the semiconductor body 16. The conductive material 24 extends to a surface of the body 16. It is noted that a layer 32 of silicon nitride, (i.e., a pad nitride) is on the semiconductor body 16, as indicated, and that here the doped polysilicon material 24 extends to the upper surface of the silicon nitride layer 32, as shown in FIGS. 2 and 3.

Figure 4:
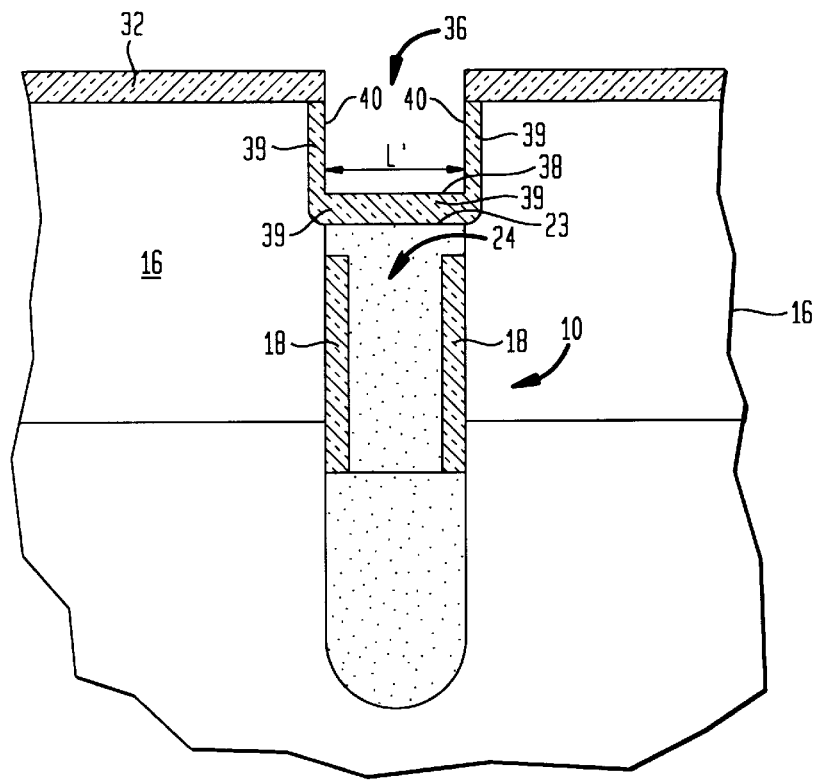
FIG. 4 is a cross-sectional elevation view of the portion of a semiconductor body having a trench capacitor formed therein after forming a recess in the upper portion of such capacitor at one stage of the process according to the invention.

Next, referring to FIG. 4, a recess 36 is formed in the upper portions of the conductive material 24 (FIG. 3). The recess 36 has a bottom 38 below the surface of the semiconductor body 16 and sidewalls 40 in the semiconductor body 16. Here, the bottom 38 is recessed 50–400 nm below the surface to form a void over the capacitor 10. The bottom 38 of the recess 36 must also be above the top of collar 18. It should be understood that other processing or deposition steps may follow which includes the formation of an insulating layer over the bottom 38.

A thin dielectric layer 39 (FIG. 1) of silicon dioxide is then formed, here thermally grown, on the exposed silicon recess 36 portion of the sidewalls 40 which will be the gate channel G while a thicker layer of such silicon dioxide is thermally grown over the top of the doped polycrystalline silicon 24. The silicon dioxide layer 39 is thicker over the doped polycrystalline silicon 24 than over the portion of the silicon sidewall 40 where the gate channel G will be because the doping of the polycrystalline silicon 24 is greater than the doping on the sidewall 40 portion. For example, the doping concentration of the doped polycrystalline silicon 24 is in the order of $2\times10^{19}$ to $5\times10^{19}$ per $cm^3$ whereas the doping concentration of the gate channel G is in the order of $2\times10^{17}$ per $cm^3$. (It is noted that, for convenience, the dielectric layer 39 is not shown in the succeeding FIGS.)

Figure 5:
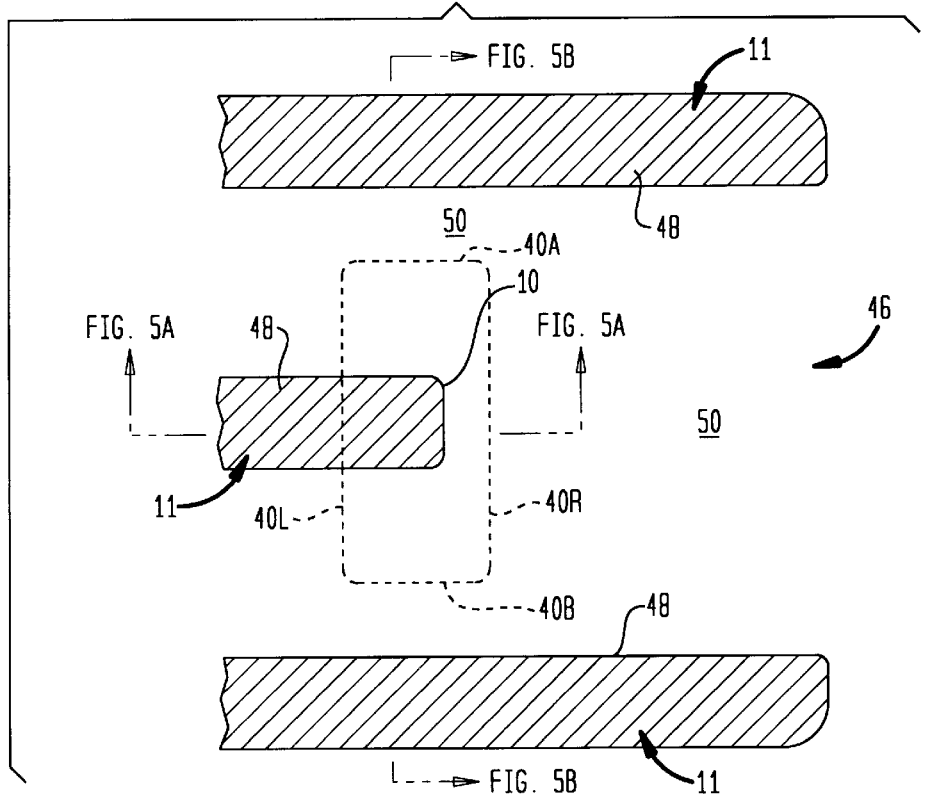
FIG. 5 is a plan view of a portion of a semiconductor body after the recess of FIG. 4 is formed and after a mask is aligned with respect to the trench capacitor in accordance with the invention.
Figure 5A:
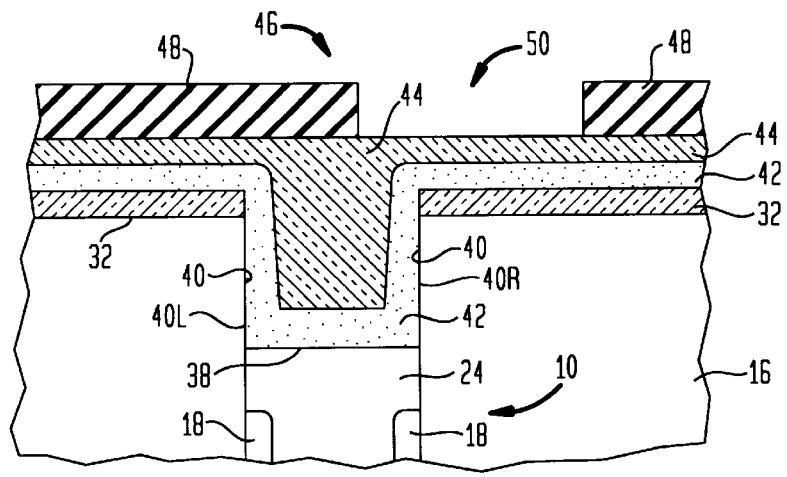
Figure 6A:
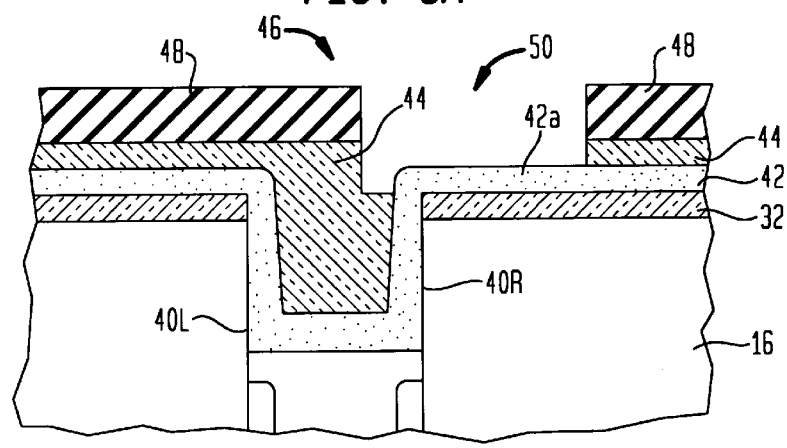

Next, referring to FIGS. 5 and 5A, a first material 42, here a silicon material, such as for example, polycrystalline silicon or amorphous silicon, is deposited as a layer of uniform, predetermined thickness, over the surface of the semiconductor body 16 (more particularly on the surface of the nitride layer 32) and on the sidewalls 40 and the bottom 38 of the recess 36 with such first material 42 under-filling such recess 36. Next, a second material 44, here an antireflection layer, oxide, polynitride, or oxynitride, is deposited over the first material 42 and fills the under-filled recess to form a substantially planar surface over the semiconductor body. Next, a mask 46 is aligned with respect to the capacitor 10 over the planar surface with masking portions 48 of such mask 46 being disposed over the active area 11 and window, or opening, 50 in such mask 46 being disposed over isolation regions (i.e., over the body 16 where the STI regions 28 are to be formed) in the semiconductor body 16 between the active areas 11. It is noted that the masking portions 48 cover one sidewall portion, here the left sidewall portion 40L in FIG. 5A of the recess 36 and the window 50 is disposed over an opposite sidewall portion, here sidewall portion 40R of the recess 36.

An anisotropic etch is brought into contact with the mask 46 to selectively remove the exposed portions of the second material 44 (FIG. 6A) over the sidewall portion 40R of the recess. It is noted that the anisotropic etch removes portions of the second material 44 exposed by the window 50 disposed over the bottom portions of the recess to expose underlying portions of the first material 42 while leaving while leaving substantially un-etched exposed underlying portions of the first material 42. Thus, the etch used to remove the portions of the second material 44 exposed by window 50, here for example, well known oxide Reactive Ion Etch (RIE) selective to silicon (i.e., an oxide spacer type etch which etches silicon dioxide at a substantially higher rate than silicon) is selected so that it will not etch the first material 42, which is here silicon.

Figure 7A:
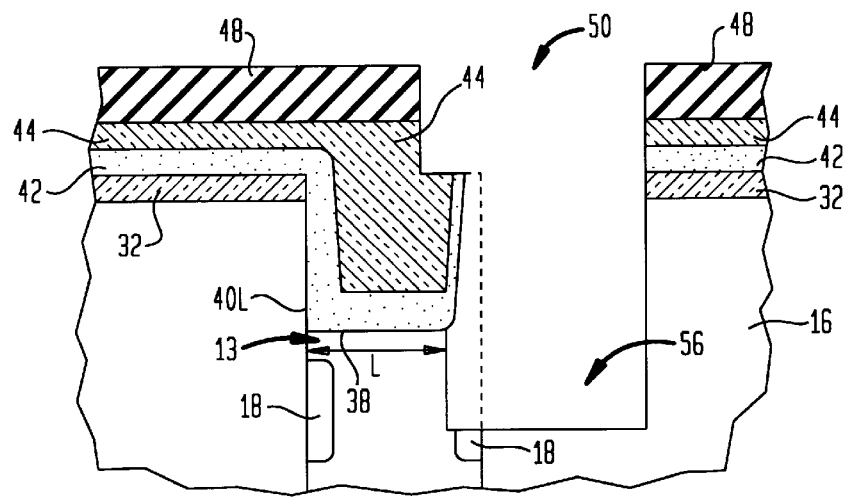

Next, referring to FIG. 7A, another etch here a reactive ion etch which etches the first material 42 without etching the second material 44 is used to selectively remove the exposed portions of the first material 42; (i.e., the portions 42a (FIG. 6A) of the first material 42 exposed by previously etching away portions of the second material 44, as described in FIG. 6A). The etching thereby exposes underlying portions of the semiconductor body 16 while leaving the bottom of the recess un-etched. Thus, semiconductor material is provided below the bottoms 38 to serve as the coupling region 13 (FIG. 1) for electrical connection to the buried strap 22 (FIG. 1) for the cell. It is noted that the coupling region 13 has a length, L. The exposed underlying portions of the semiconductor body is etched, here with a silicon RIE selective to oxide (i.e., an gate poly RIE etch which etches silicon at a significantly higher etch rate than silicon dioxide) and selective to the mask 48, again a vertical etching process to form a shallow trench 56 while leaving the bottom 38 of the recess un-etched to provide in the semiconductor material below the bottom of such recess for the coupling region 13 which maintains its length, L.

Figure 8B:
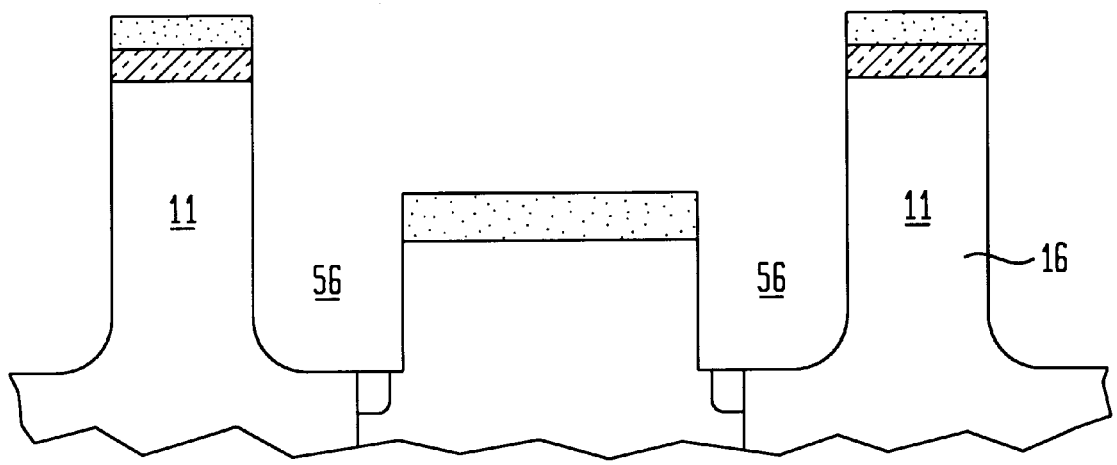
Figure 8A:
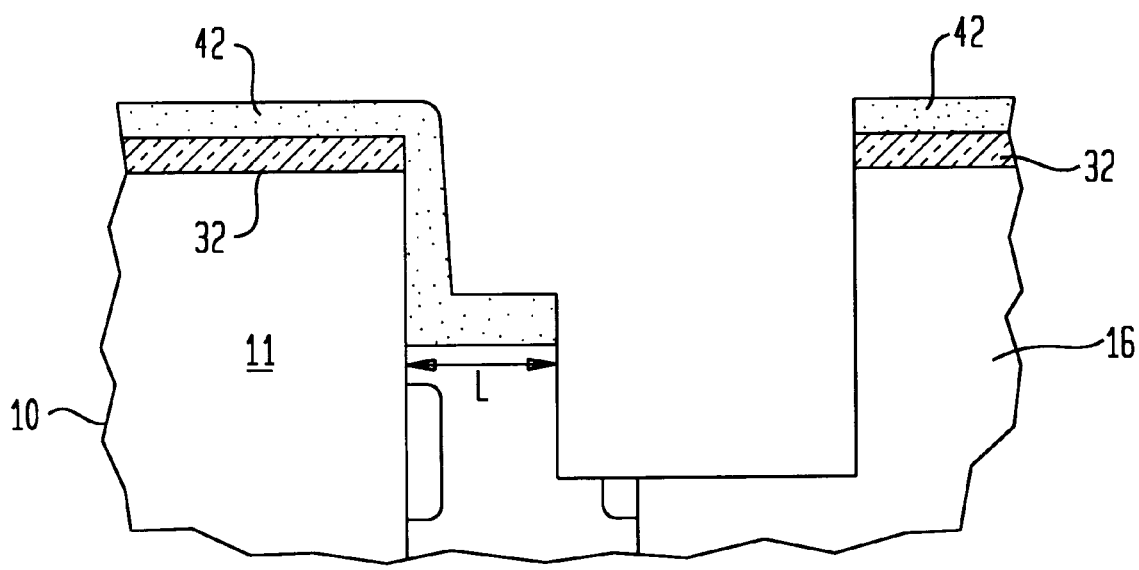

Next, the remaining portions of the second material are optionally removed using an oxide RIE etch. It is noted that the etch is a non-silicon etch. The resulting structure is shown in FIG. 8A. Next, referring to FIG. 9A, an insulating material 60, for example TEOS, is formed in the shallow trench to form a shallow trench isolation (STI) region 28 thereby defining the active areas 11. During subsequent processing, layers 32 and 42 are removed, bitline diffusion 71 (FIG. 1) and node diffusion 72 (strap out-diffusion) are formed. These diffusions serve as the source-drain diffusions, here indicated by the N+ drain D region in FIGS. 1 and 10A for the vertical MOSFET whose gate conductor is the remaining portion of first material 42 on the sidewalls. In order to understand the effect of the process described above when the mask is misaligned slightly to the left of the position shown in FIG. 5A, reference is made to FIGS. 5A' through 8A'. More particularly, FIG. 5A' corresponds to FIG. 5A except that the mask 46 in FIG. 5A is shifted to the left in FIG. 5A' and such left-shifted mask is designated as mask 46'. Thus, it is noted that the window 50 in mask 46' is closer to sidewall 40L than mask 46 (FIG. 5A). The processing described above in connection with FIGS. 5A through 8A is repeated and the resulting structures are shown in FIGS. 5A' through 8A', respectively. It is noted that even with some misalignment of the mask 46', the length, L, of the coupling region 13 remains unchanged. More particularly, the minimum length L of the coupling region 13 is defined by the length L' of the bottom 38 (FIG. 4) of the recess 36 minus the predetermined thickness of the first material 42 regardless of the misalignment of mask 46' as long as such misalignment still places the left edge of the window 50 at least to the right of the left sidewall 40L.

Referring again to FIG. 5 and FIGS. 5B through 9B, the effect of the structure shown in FIG. 5 on the process described above in connection with FIGS. 5A–9A is shown. It is noted that the cross-sections shown in FIGS. 5B–9B are taken through line 5B—5B in FIG. 5. Thus, the recess 36 is formed in the upper portions of the conductive material 24 (FIG. 3) as shown in FIG. 4. Next, referring to FIG. 5B, the first material 40 is deposited as a layer of uniform, predetermined thickness, over the surface of the semiconductor body 16 (more particularly on the surface of the nitride layer 32) and on the sidewalls 40 and the bottom 38 of the recess 36 with such first material 42 under-filling such recess 36. Next, the second material 44 is deposited over the first material 42 and fills the under-filled recess 36 to form a substantially planar surface over the semiconductor body 16. Next, the mask 46 is aligned with respect to the capacitor 10 over the planar surface with masking portions 48 of such mask 46 disposed over the active areas and windows 50 in such mask 46 being disposed over the STI isolation regions to be formed in the semiconductor body 16 between the active areas 11 (FIG. 5). It is noted that the masking portions 48 cover one sidewall portion, here the left sidewall portion 40L in FIG. 5 of each one of the recesses 36 and the windows 50 are disposed over the remaining sidewall portion, here sidewall portions 40T, 40R, and 40B of each one of the recesses 36.

The etch is brought into contact with the mask 46 to selectively remove the exposed portions of the second material 44 (FIG. 6B) over the sidewall portions 40T and 40B of each of the recesses. It is noted that the etch etches into portions of the second material 44 exposed by the windows 50 disposed over portions of each one of the recesses to expose underlying portions of the first material 42 while leaving substantially un-etched exposed underlying portions of the first material 42. Thus, the etch used to remove the portions of the second material 44 exposed by window 50 is selected so that it will not etch the first material 42, which is here silicon.

Figure 6B:
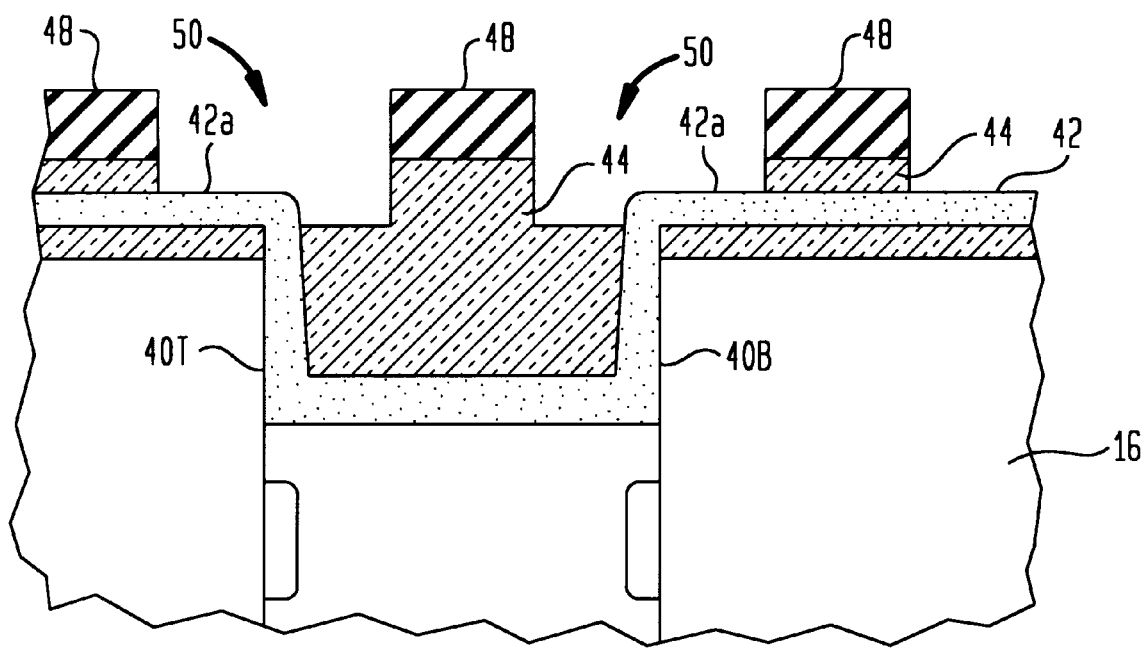
Figure 7B:
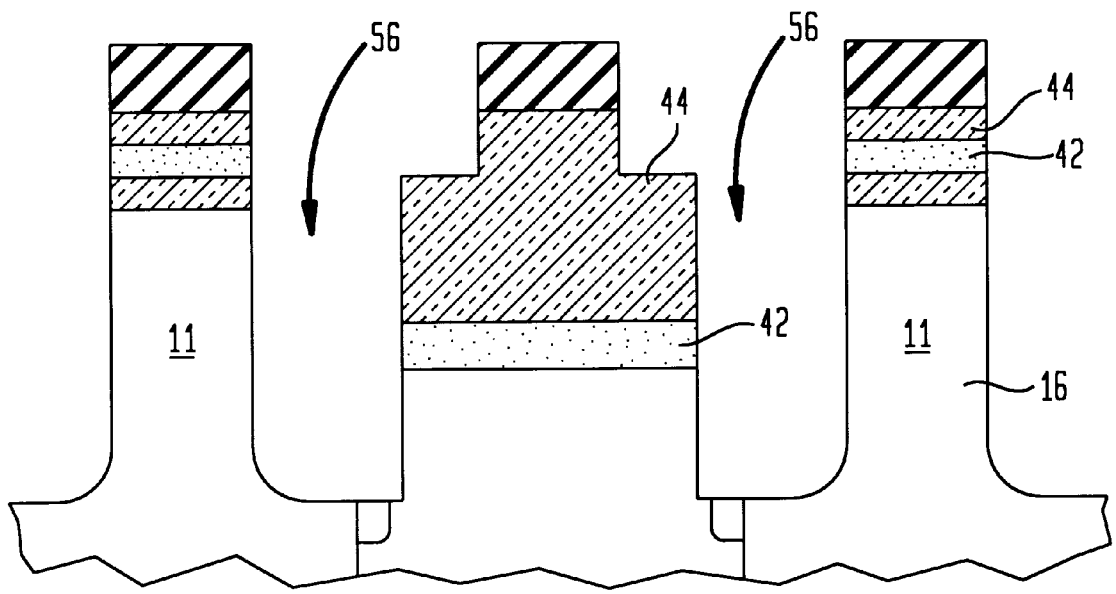

Next, referring to FIG. 6B, another etch here a reactive ion etch which etches the first material 42 without etching the second material 44. Thus the etch is used to selectively remove the exposed portions of the first material 42; (i.e., the portions 42a of the first material 42 exposed by etching away portions of the second material 44, as described in FIG. 6B) thereby exposing underlying portions of the semiconductor body 16. Next, the exposed underlying portions of the semiconductor body 16 is etched, here with a silicon RIE, again a vertical etching process to form a shallow trench 56.

Next, the remaining portions of the second material 44 are removed using an oxide RIE. Such etch will not etch silicon. The resulting structure is shown in FIG. 8B. Next, referring to FIG. 9B, an insulating material 60 is formed in the shallow trench to form a shallow trench isolation (STI) region 28 being disposed in said second portion of the capacitor and defining the active areas 11.

Figure 5B:
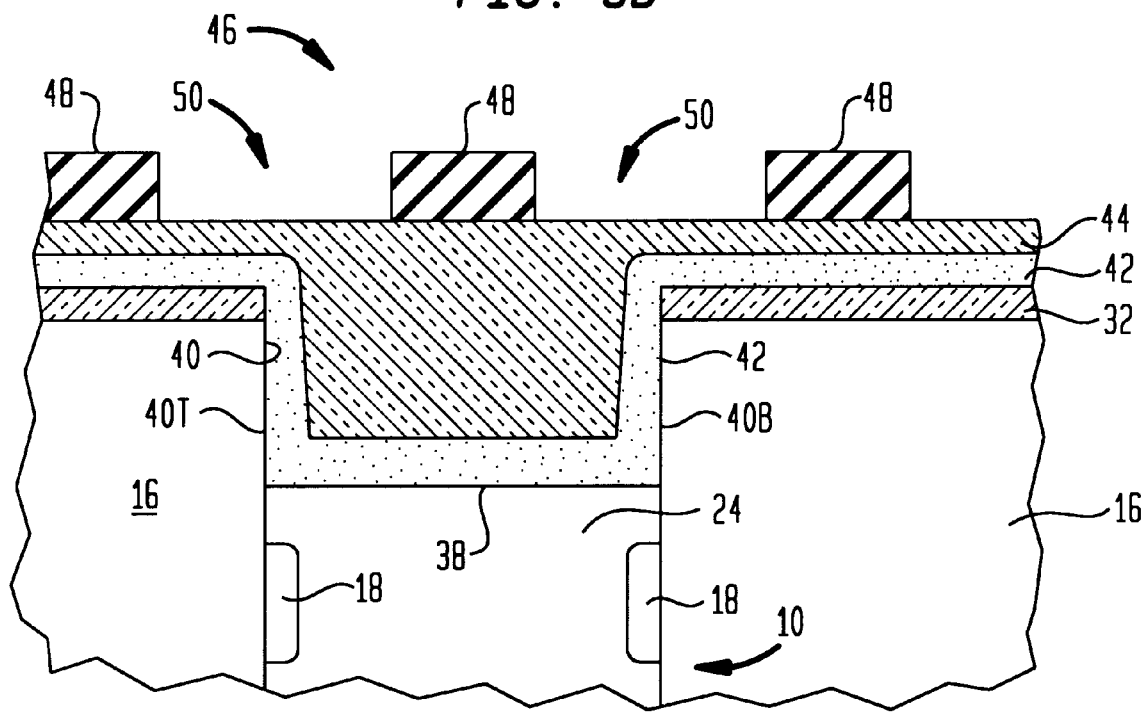

In order to understand the effect of the process described above when the mask is misaligned slightly to the left from the position shown in FIG. 5B, reference is made to FIGS. 5B' through 8B'. More particularly, FIG. 5B' corresponds to FIG. 5B except that the mask 46 in FIG. 5B is shifted to the left in FIG. 5B' and such left-shifted mask is designated as mask 46'. Thus, it is noted that the window 50 in mask 46' is closer to sidewall 40B than mask 46 (FIG. 5B'). The processing described above in connection with FIGS. 5B through 8B is repeated and the resulting structures are shown in FIGS. 5B' through 8B', respectively. Thus, after removing the portions of the second material exposed by windows 50, as shown in FIG. 6B', portions 42a of the first material are exposed. The exposed portions 42a are removed using the remaining, i.e., previously un-etched portions of the second material 44 as a mask. Etch also etches into the portions of the silicon body 16 under the portions 42a of the first layer, to produce the structure shown in FIG. 7B'.

Figure 9A:
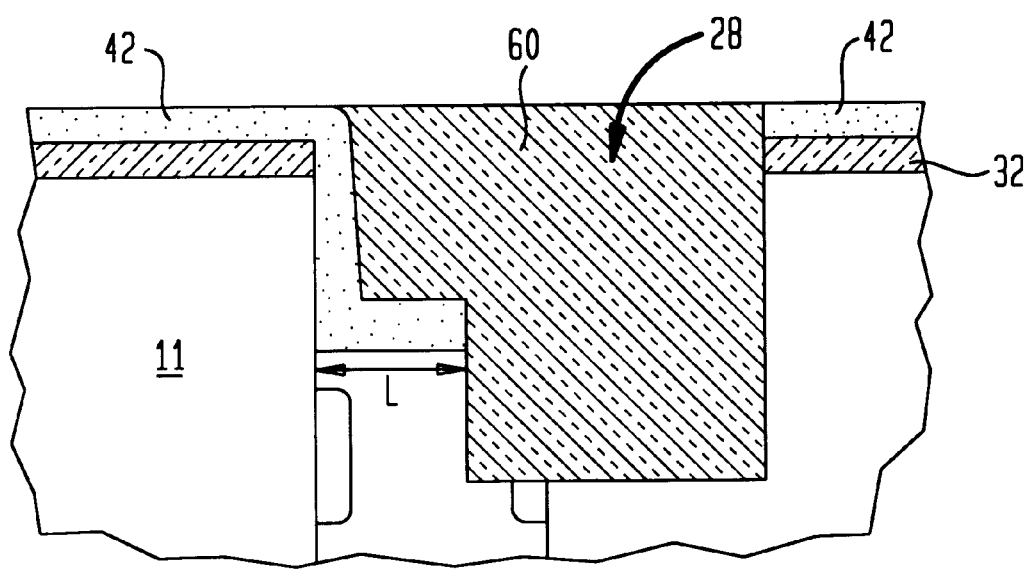
Figure 9B:
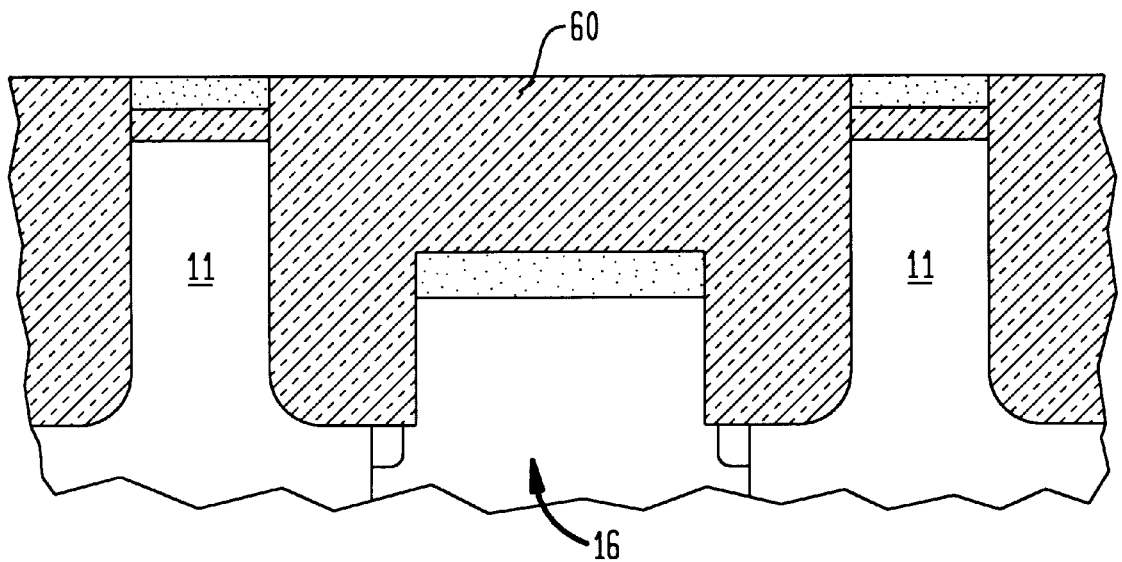
Figure 10A:
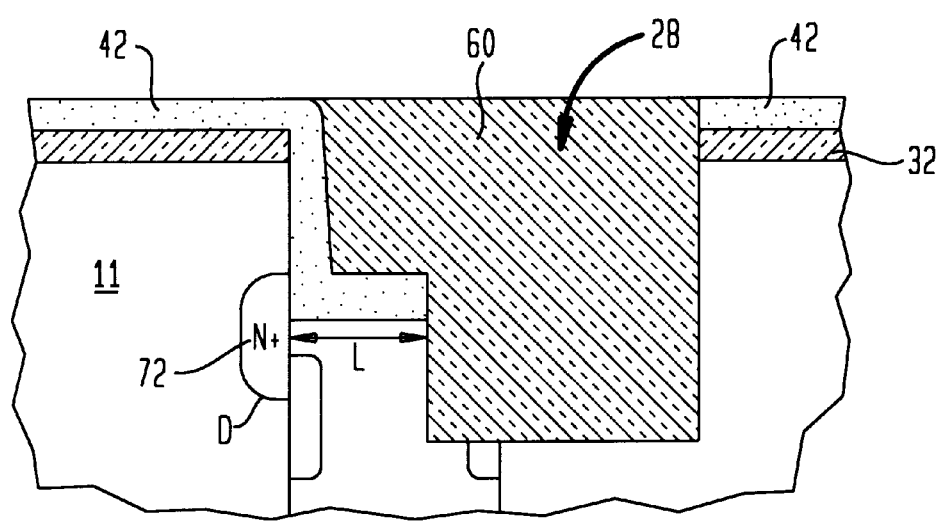

Referring to FIG. 9B', the remaining, exposed portions of the second material 44 are etched to produce the structure shown in FIG. 8B'. Referring to FIG. 9B', the insulating material 60 is deposited to form the STI regions 28 and thereby define the active areas 11. Thus, with the method described above, greater mask misalignment tolerances are permissible without corresponding changes in the length, and therefore the resistance, of a coupling region in the storage node of the capacitor which is electrically connected to the cell transistor through the coupling region. Further, greater mask misalignment tolerances are permissible while forming electrical isolated active areas 11.

Other embodiments are within the spirit and scope of the appended claims.

What is claimed is:

1. A method, comprising:
    (a) forming a trench capacitor in a semiconductor body;
    (b) forming a recess in the upper portion of the capacitor with such recess having sidewalls in the semiconductor body;
    (c) depositing a first material over the sidewalls and over a bottom of the recess;
    (d) depositing a second material over the first material;
    (e) providing a mask over the second material, such mask having: a masking region to cover one portion of said recess bottom; and a window over a portion of said recess sidewall and another portion of said recess bottom to expose underlying portions of the second material;
    (f) selectively removing portions of the exposed underlying portions of the second material while leaving substantially un-etched exposed underlying portions of the first material;
    (g) selectively removing the exposed portions of the first material and underlying portions of the semiconductor body;
    (h) forming an isolation region in the removed portions of the semiconductor body.

2. The method recited in claim 1 wherein the mask providing comprises:
    providing the mask over the second material with a masking region covering one portion of said recess sidewall and one portion of said recess bottom and with a window disposed over an opposite portion of said recess sidewall and an opposite portion of said recess bottom to expose underlying portions of the second material.

3. The method recited in claim 1 wherein the forming an isolation region in the removed portions of the semiconductor body comprises:
    etching into the exposed underlying portions of the semiconductor body to form a shallow trench in the semiconductor body; and
    forming an insulating material in the shallow trench to form a shallow trench isolation region.

4. A method, comprising:
    (a) forming a capacitor having a conductive material in a trench in a semiconductor body;
    (b) forming a recess in an upper portion of the conductive material with such recess having sidewalls in the semiconductor body;
    (c) depositing a first material over the surface of the semiconductor body and onto the sidewalls and a bottom of the recess with such first material under-filling such recess;
    (d) depositing a second material over the first material with such second material filling the under-filled recess;
    (e) forming a mask over the second material, such mask having an opening therein, the mask masking one portion of said recess sidewall and one portion of said recess bottom and the opening being disposed over an opposite portion of said recess sidewall and an opposite portion of said recess bottom to expose underlying portions of the second material;
    (f) selectively removing portions of the exposed underlying portions of the second material while leaving substantially un-etched exposed underlying portions of the first material;
    (g) selectively removing the exposed portions of the first material exposing underlying portions of the semiconductor body;
    (h) forming an isolation region in the exposed underlying portions of the semiconductor body.

5. The method recited in claim 4 wherein the isolation region forming comprises:
    (a) etching into the exposed underlying portions of the semiconductor body to form a shallow trench in the semiconductor body; and
    (b) forming an insulating material into the shallow trench to form a shallow trench isolation region.

6. A method for forming a DRAM cell in a semiconductor body, such cell having a transistor in an active area of the semiconductor body electrically connected to a capacitor disposed in a trench in such semiconductor body, a first upper portion of the capacitor being electrically coupled to the transistor and an opposite upper second portion of such capacitor being electrically isolated from the active area, comprising:
    (a) forming the capacitor in the trench of the semiconductor body, such capacitor having: an insulator on a lower sidewall portion thereof; and, a conductive material disposed in the trench, a lower portion of the conductive material being disposed on the insulator and an upper portion of the conductive material being disposed on the semiconductor body, such conductive material extending to a surface of the body;
    (b) forming a recess in the upper portion of the conductive material, such recess having a bottom below the surface of the semiconductor body and with sidewalls in the semiconductor body;
    (c) depositing a first material over the surface of the semiconductor body and onto the sidewalls and the bottom of the recess, with such first material under-filling such recess;
    (d) depositing a second material over the first material with such second material filling the under-filled recess forming a substantially planar surface over the semiconductor body;
    (e) forming a mask over the planar surface, such mask having an opening therein aligned with the capacitor to define the active area in the semiconductor body, the mask masking one portion of said recess sidewall and one portion of said recess bottom and the opening being disposed over an opposite portion of said recess sidewall and an opposite portion of said recess bottom to expose underlying portions of the second material;

(f) selectively removing portions of the exposed underlying portions of the second material over said recess sidewall to expose underlying portions of the first material while leaving substantially un-etched exposed underlying portions of the first material;

(g) selectively removing the exposed portions of the first material exposing underlying portions of the semiconductor body;

(h) etching into the exposed underlying portions of the semiconductor body to form a shallow trench in the semiconductor body; and 6 (i) forming an insulating material into the shallow trench to form a shallow trench isolation region defining the active region in said second upper portion of said capacitor with said opposite first portion of the capacitor being electrically connected to the transistor.

7. A method for forming an array of DRAM cells in a semiconductor body, each one of such cells having a transistor in a corresponding electrically isolated active area of the semiconductor body and a capacitor disposed in a trench in such semiconductor body, a first portion of the capacitor being electrically coupled to the transistor and an opposite, second portion of such capacitor being disposed an isolation region defining a portion of the active area region having the transistor of such cell, such method, comprising:

(a) forming an array of trench capacitors in a semiconductor body, each one of such capacitors having:
an insulator on lower sidewall portions thereof and a conductive material disposed in the trench, a lower portion of the conductive material being disposed on the insulator and an upper portion of the conductive material being disposed on the semiconductor body, such conductive material extending to a surface of the body;

(b) forming recesses in the upper portions of the conductive material, such recesses having bottoms below the surface of the semiconductor body and sidewalls in the semiconductor body;

(c) depositing a first material over the surface of the semiconductor body and onto the sidewalls and the bottoms of the recesses with such first material underfilling such recesses;

(d) depositing a second material over the first material and filling the under-filled recesses to form a substantially planar surface over the semiconductor body;

(e) aligning a mask over the planar surface with masking portions of such mask disposed over the active areas and windows in such mask being disposed over isolation regions in the semiconductor between the active areas, such masking portions covering one sidewall portion of the recesses and the windows being disposed over an opposite sidewall portion of the recesses;

(f) selectively removing the exposed portions of the second material over the opposite sidewall portion of the recesses etching into portions of the second material exposed by the windows disposed over the bottom portions of each one of the recesses to expose underlying portions of the first material while leaving while leaving substantially un-etched exposed underlying portions of the first material;

(g) selectively removing the exposed portions of the first material exposing underlying portions of the semiconductor body while leaving the bottoms of the recesses un-etched to provide in the semiconductor below the bottoms of such recesses a coupling region for each one of the cells;

(h) etching into the exposed underlying portions of the semiconductor body to form a shallow trench while leaving the bottom of the recess un-etched to provide in the semiconductor below the bottom of such recesses the coupling region for each one of the cells; and (i) forming an insulating material into the shallow trench to form a shallow trench isolation region being disposed in said second portion of the capacitor and defining the active areas.

* * * * *